(12) United States Patent
Sharma et al.

(10) Patent No.: US 11,334,256 B2
(45) Date of Patent: May 17, 2022

(54) STORAGE SYSTEM AND METHOD FOR BOUNDARY WORDLINE DATA RETENTION HANDLING

(71) Applicant: Western Digital Technologies, Inc., San Jose, CA (US)

(72) Inventors: Sahil Sharma, San Jose, CA (US); Nian Niles Yang, Mountain View, CA (US); Phil Reusswig, Mountain View, CA (US); Rohit Sehgal, San Jose, CA (US); Piyush A. Dhotre, Bangalore (IN)

(73) Assignee: Western Digital Technologies, Inc., San Jose, CA (US)

(*) Notice: Subject to any disclaimer, the term of this patent is extended or adjusted under 35 U.S.C. 154(b) by 223 days.

(21) Appl. No.: 16/780,281

(22) Filed: Feb. 3, 2020

(65) Prior Publication Data

US 2021/0240358 A1    Aug. 5, 2021

(51) Int. Cl.
*G06F 3/06* (2006.01)
*G11C 11/409* (2006.01)
*G06F 11/07* (2006.01)
*G11C 11/408* (2006.01)

(52) U.S. Cl.
CPC .......... *G06F 3/0619* (2013.01); *G06F 3/0653* (2013.01); *G06F 3/0659* (2013.01); *G06F 3/0679* (2013.01); *G06F 11/0757* (2013.01); *G11C 11/409* (2013.01); *G11C 11/4085* (2013.01)

(58) Field of Classification Search
CPC .... G06F 3/0619; G06F 3/0653; G06F 3/0659; G06F 3/0679; G06F 11/0757; G11C 11/4085; G11C 11/409; G11C 11/5628; G11C 11/5621; G11C 16/0483; G11C 16/32; G11C 16/349; G11C 16/08; G11C 2211/5641

See application file for complete search history.

(56) References Cited

U.S. PATENT DOCUMENTS

| | | | |
|---|---|---|---|
| 9,933,963 B1* | 4/2018 | Alhussien | G06F 3/0679 |
| 10,048,863 B1* | 8/2018 | Goss | G06F 3/064 |
| 10,515,008 B2 | 12/2019 | Sehgal et al. | |
| 2013/0262745 A1* | 10/2013 | Lin | G06F 3/0659 |
| | | | 711/103 |
| 2016/0098216 A1* | 4/2016 | Huang | G06F 11/1072 |
| | | | 714/37 |

(Continued)

*Primary Examiner* — Reginald G Bragdon
*Assistant Examiner* — Curtis James Kortman
(74) *Attorney, Agent, or Firm* — Crowell & Moring LLP

(57) ABSTRACT

A storage system and method for boundary wordline data retention handling are provided. In one embodiment, the storage system includes a memory having a single-level cell (SLC) block and a multi-level cell (MLC) block. The system determines if the boundary wordline in the MLC block has a data retention problem (e.g., by determining how long it has been since the boundary wordline was programmed). To address the data retention problem, the storage system can copy data from a wordline in the SLC block that corresponds to the boundary wordline in the MLC block to a wordline in another SLC block prior to de-committing the data in the SLC block. Alternatively, the storage system can reprogram the data in the boundary wordline using a double fine programing technique.

22 Claims, 11 Drawing Sheets

(56) References Cited

U.S. PATENT DOCUMENTS

| | | | |
|---|---|---|---|
| 2018/0189135 A1* | 7/2018 | Naik | G11C 29/028 |
| 2019/0034290 A1* | 1/2019 | Guo | G06F 3/0679 |
| 2020/0264792 A1* | 8/2020 | Paley | G06F 3/0679 |
| 2021/0109856 A1* | 4/2021 | Lee | G06F 12/0882 |

* cited by examiner

STORAGE SYSTEM AND METHOD FOR BOUNDARY WORDLINE DATA RETENTION HANDLING

BACKGROUND

The memory in a storage system can contain single-level cell (SLC) blocks that can store one bit per cell and multi-level cell (MLC) blocks that can store several bits per cell. For example, a quad-level cell (QLC) block can store four bits per cell. While using MLC blocks increases the data storage capacity of a storage system, MLC blocks can have more issues with accurately retaining data than SLC blocks.

DETAILED DESCRIPTION

Overview

Figure 1A:
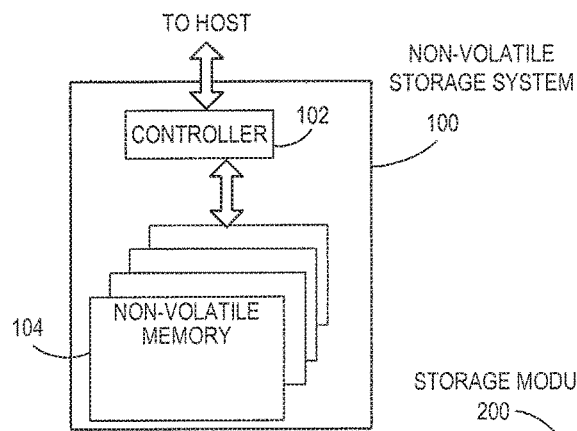
FIG. 1A is a block diagram of a non-volatile storage system of an embodiment.

By way of introduction, the below embodiments relate to a storage system and method for boundary wordline data retention handling. In one embodiment, a storage system is provided comprising a memory comprising a first single-level cell (SLC) memory area, a second SLC memory area, and a multi-level cell (MLC) memory area; and a controller. The controller is configured to write data to both the first SLC memory area and the MLC memory area; determine whether an amount of time that has passed since a last-written wordline in the MLC memory area was written is longer than a threshold amount of time; and in response to determining that the amount of time is longer than the threshold amount of time: copy data from a wordline in the first SLC memory area that corresponds to the last-written wordline in the MLC memory area to a wordline in the second SLC memory area; and update a mapping table to reflect the copy.

In some embodiments, the controller is further configured to, in response to a command to read the MLC memory area: read data from wordlines prior to the last-written wordline in the MLC memory area; and instead of reading the last-written wordline in the MLC memory area, read the data from the wordline in the second SLC memory area.

In some embodiments, the controller is further configured to log an identification of the last-written wordline in the MLC memory area and a time when the last-written wordline was written.

In some embodiments, the identification and time are logged in volatile memory in the storage system.

In some embodiments, the controller is further configured to de-commit the data from the first SLC memory area.

In another embodiment, a method is provided that is performed in a storage system including a memory comprising a single-level cell (SLC) block and a multi-level cell (MLC) block. The method comprises: programming data to both the SLC block and the MLC block; determining whether a predetermined amount of time has passed since a boundary wordline in the MLC block was programmed; and in response to determining that the predetermined amount of time has passed, re-programming the data in the boundary wordline in the MLC block.

In some embodiments, the data is programmed in the boundary wordline in the MLC block using a fine programing technique, and re-programmed in the boundary wordline using a double fine programing technique.

In another embodiment, a storage system is provided comprising: a memory comprising a single-level cell (SLC) memory area and a second SLC memory area; means for writing data to both the SLC memory area and the MLC memory area; means for determining whether a last-written wordline in the MLC memory area has a data retention problem; and means for, in response to determining that the last-written wordline in the MLC memory area has a data retention problem, correcting the data retention problem.

In some embodiments, the data retention problem is corrected by copying data from a wordline in the SLC memory area that corresponds to the last-written wordline in the MLC memory area to a wordline in another SLC memory area.

In some embodiments, the data retention problem is corrected by re-programming the data in the last-written wordline in the MLC memory area.

Other embodiments are possible, and each of the embodiments can be used alone or together in combination. Accordingly, various embodiments will now be described with reference to the attached drawings.

Embodiments

Figure 1B:
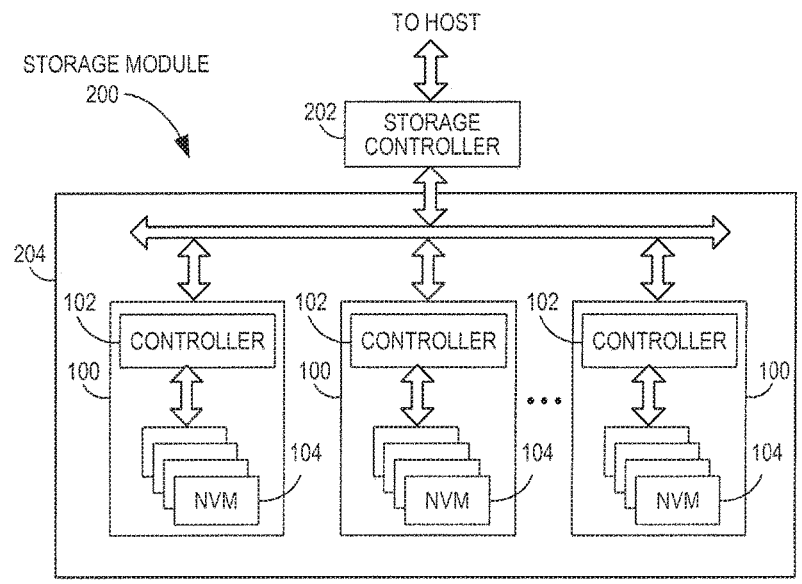
FIG. 1B is a block diagram illustrating a storage module of an embodiment.
Figure 1C:
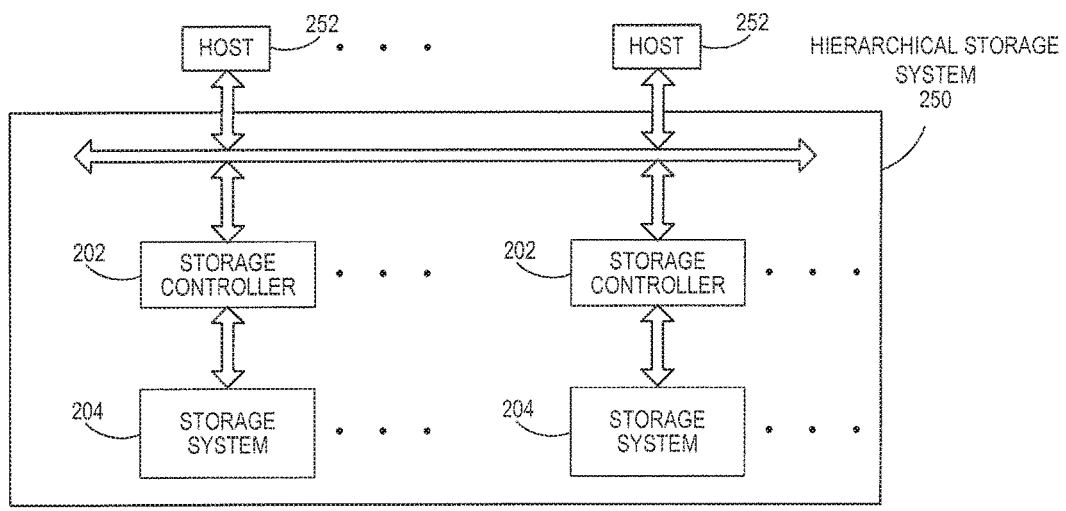
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
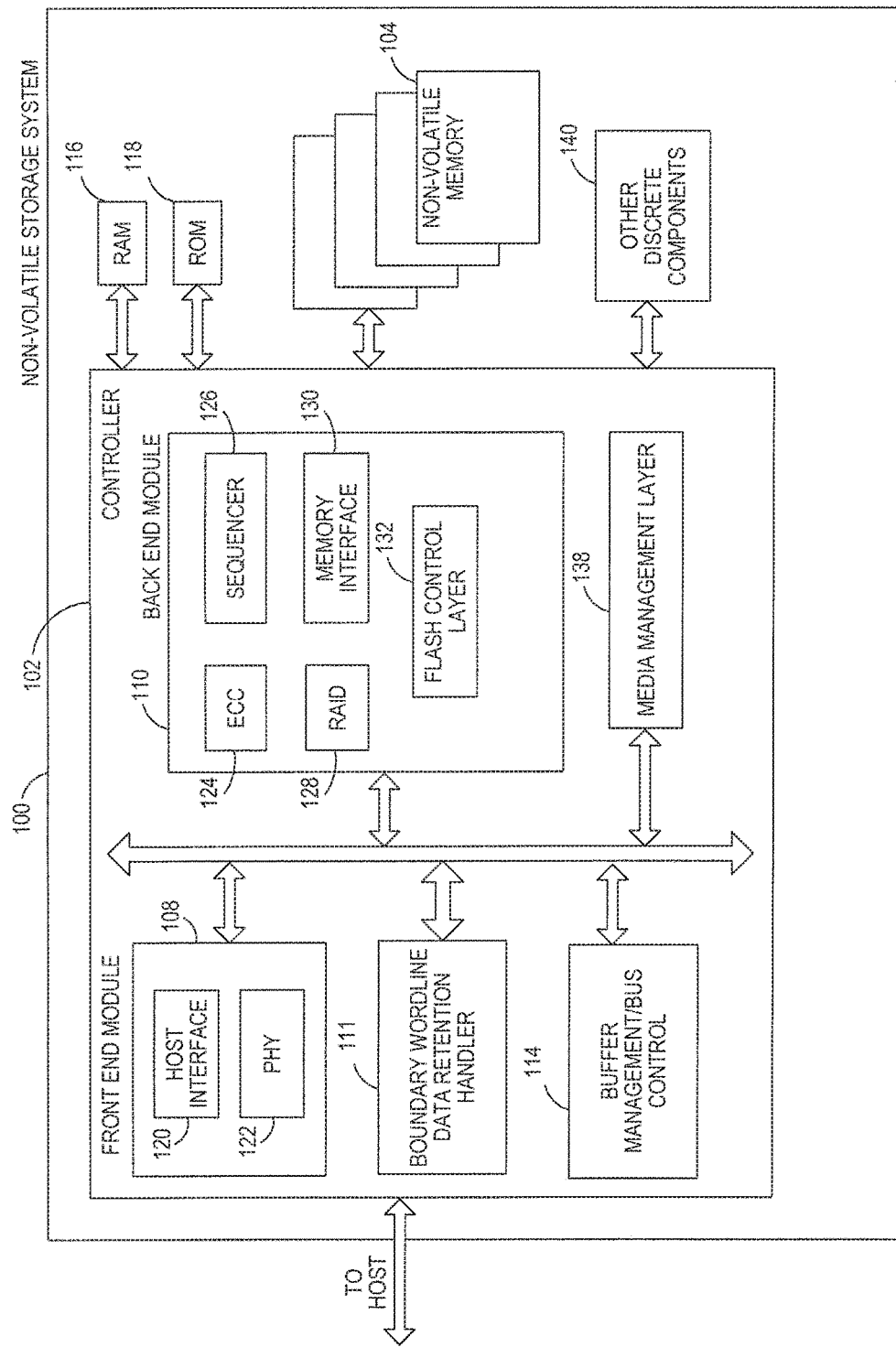
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a boundary wordline data retention handler 111, which is discussed in more detail below, and can be implemented in hardware or software/firmware. The boundary wordline data retention handler 111 can be configured to perform the algorithms and methods discussed below and shown in the attached drawings.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
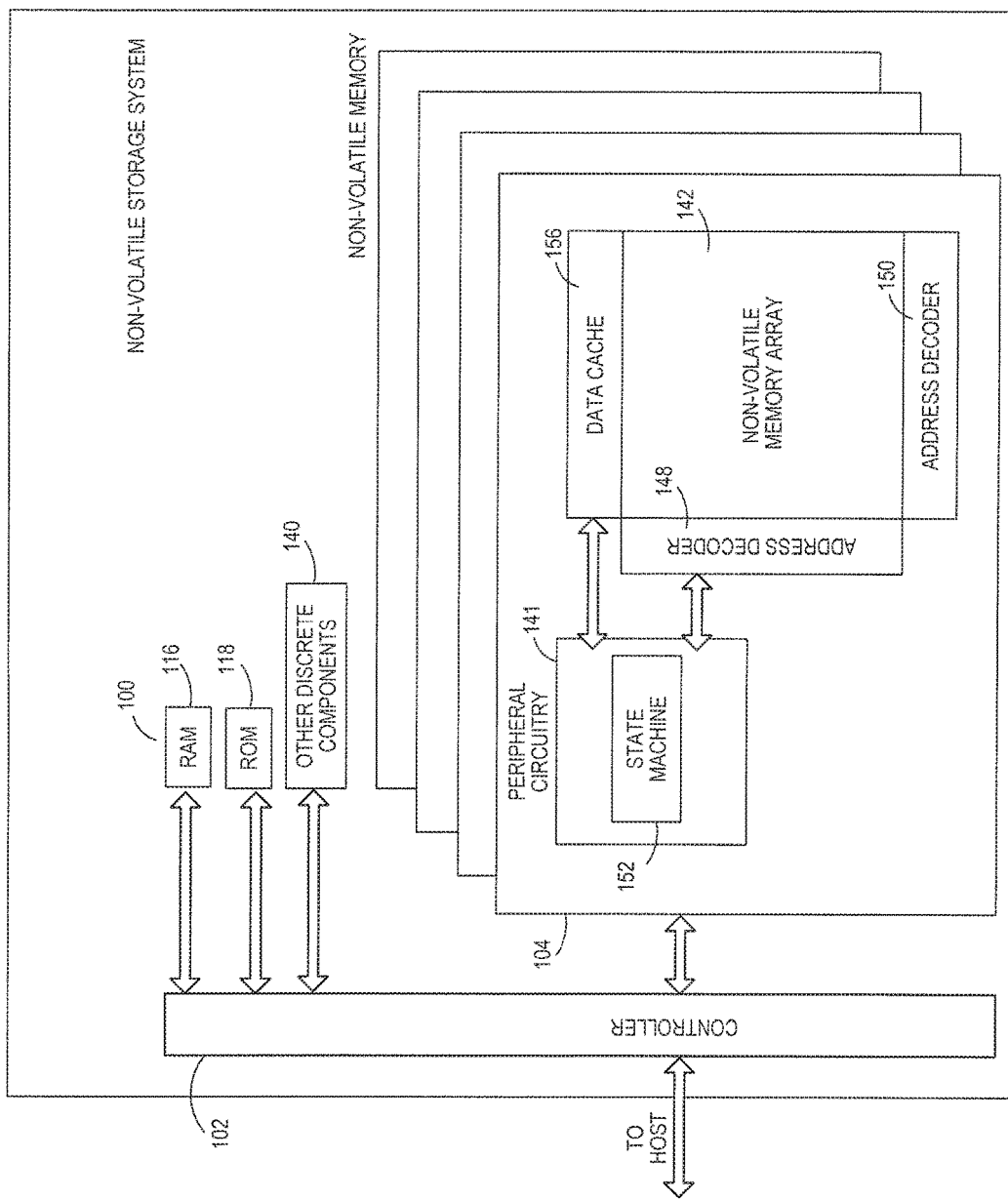
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

As mentioned above, the memory in a storage system can contain single-level cell (SLC) blocks that can store one bit per cell (sometimes referred to herein as "X1 memory") and multi-level cell (MLC) blocks that can store several bits per cell. For example, a quad-level cell (QLC) block can store four bits per cell (sometimes referred to herein as "X4 memory"). While using MLC blocks increases the data storage capacity of a storage system, MLC blocks can have more issues with accurately retaining data than SLC blocks.

Data retention issues are particularly problematic with a "boundary wordline" (i.e., the last written wordline in a block). If all the wordlines in a block are written, that block is considered closed. However, if all of the wordlines in a block are not written, that block is considered open, as additional wordlines can be written to the block over time. The last written wordline in the block is the boundary wordline, as it is the boundary between the written and unwritten wordlines in a block. The boundary wordline can move as additional data is written in the block before it is closed.

Generally speaking, the longer a given wordline serves as a boundary wordline, the greater the chance that the data stored in that wordline will have a data retention problem. The following embodiments provide boundary wordline data retention handling techniques. These embodiments can be used to maintain performance and quality of service (QoS) by avoiding read error handling (REH) during the read performance path if the reads happen to fall on the boundary wordlines and experience a high temperature bake. Before turning to examples of those techniques, the following paragraphs will illustrate the data retention issue with boundary wordlines in a Bit Cost Scalable (BiCS) 4×4 1.33 terabyte memory.

Figure 3:
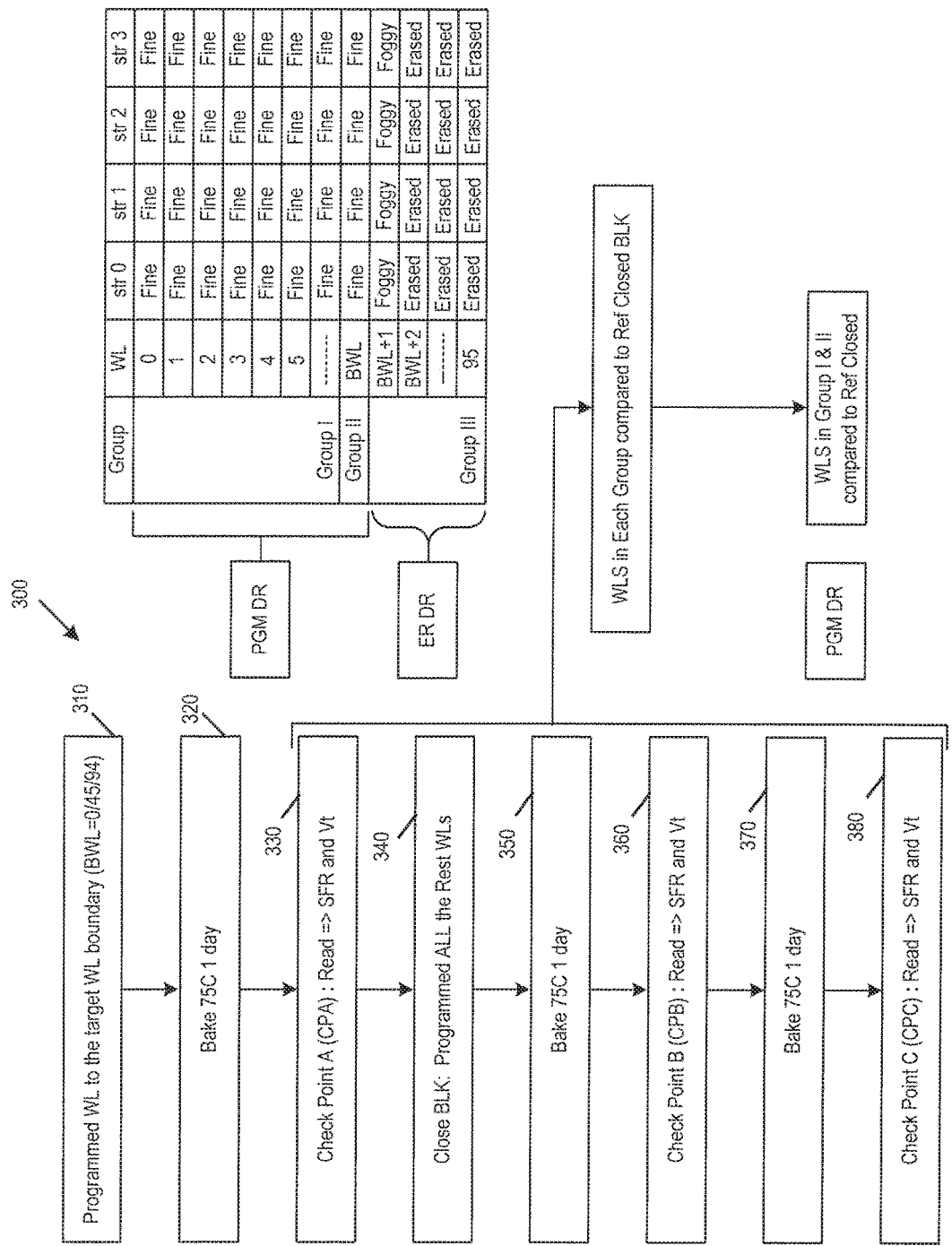
FIG. 3 is a flow chart of a test flow used in an embodiment to illustrate data retention issues with a boundary wordline.

FIG. 3 is a flow chart 300 of the test flow used with the memory to illustrate the data retention issue. As shown in FIG. 3, the memory is programmed up to the boundary wordline (act 310), and then the memory is baked at 75 C for one day (act 320). The memory is read to determine the sector failure rate (SFR) and Vt (check point A) (act 330). Then, the block is closed, and all the other wordlines are programmed (act 340). After baking the memory at 75 C for one day (act 350), the memory is again read to determine the sector failure rate (SFR) and Vt (check point A) (act 360). After baking the memory at 75 C for another day (act 370), the memory is again read to determine the sector failure rate (SFR) and Vt (check point C) (act 380). As shown in FIG. 3, the wordlines in the memory are grouped, and the wordlines in Groups I and II are compared to a reference closed group.

Figure 4A:
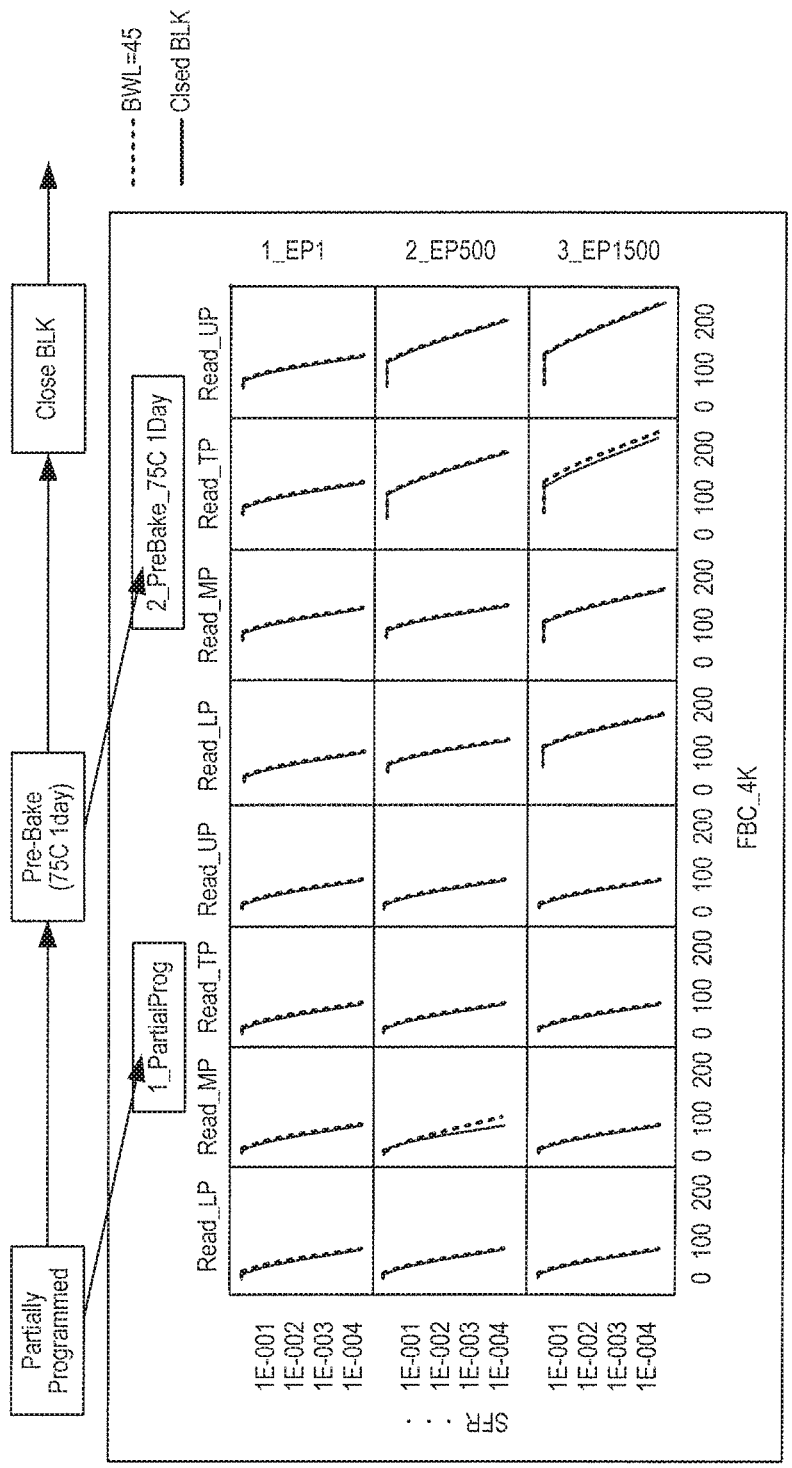
FIGS. 4A and 4B are graphs of experimental data of an embodiment for a first group of wordlines.
Figure 4B:
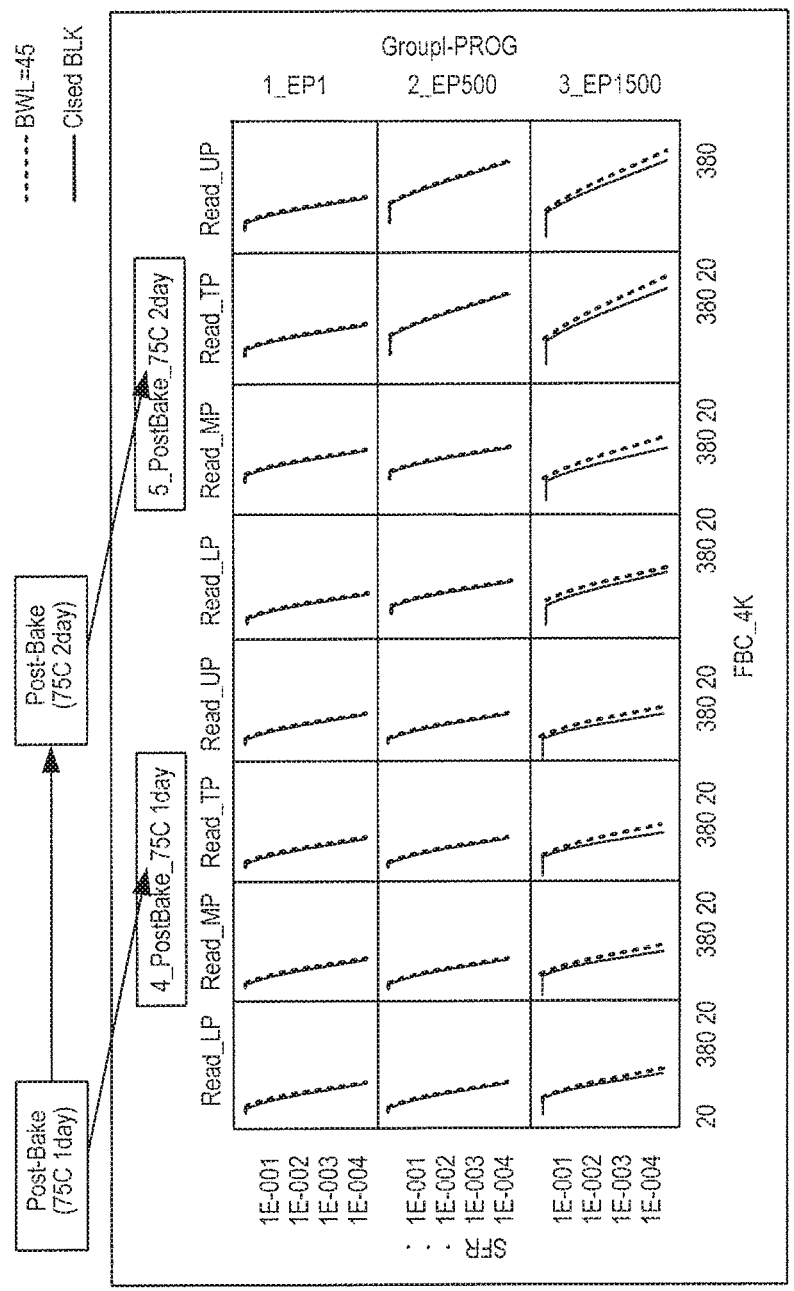
Figure 5A:
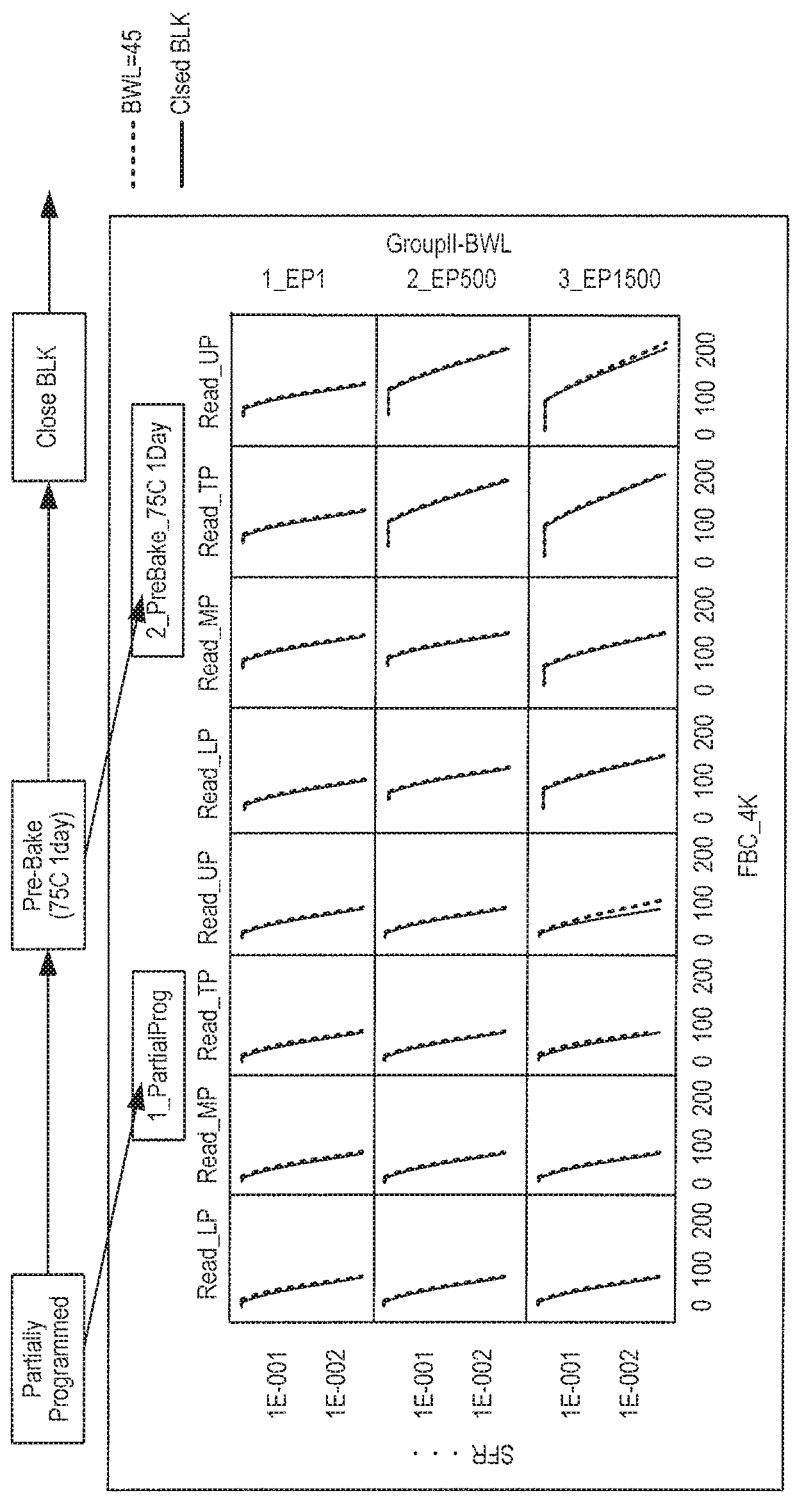
FIGS. 5A and 5B are graphs of experimental data of an embodiment for a second group of wordlines.
Figure 5B:
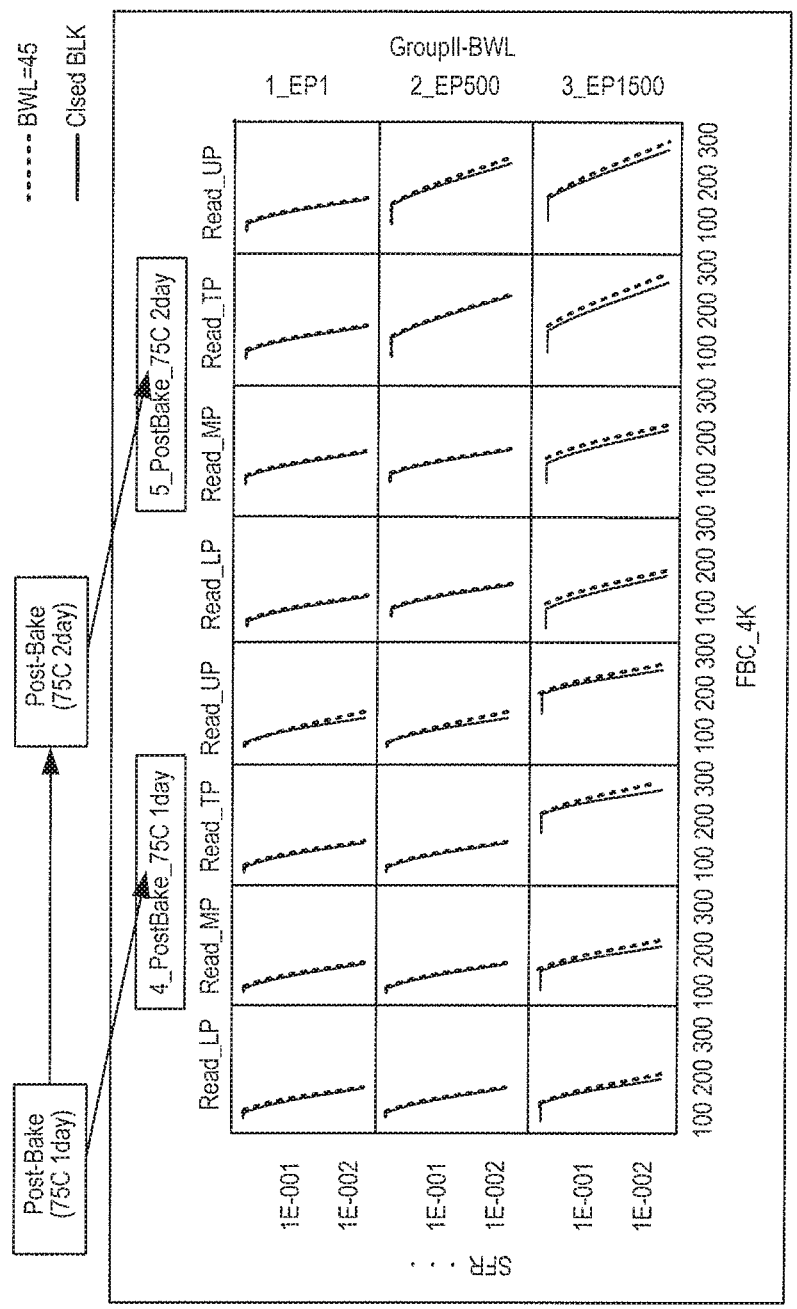

In Group I, the boundary wordline is wordline 45, and the tested wordlines are those prior to wordline 45. In Group II, the boundary wordline is wordline 45, but the tested wordline is wordline 45. FIGS. 4A and 4B show the experimental data for Group I, and FIGS. 5A and 5B show the experimental data for Group II. As can be seen from this data, for Group I, open blocks and closed blocks have comparable sector failure rates (SFR) throughout programming, pre-bake, and post-bake. Further, a high erase-program (EP) cycle (1.5K) shows slightly worse SFR after post-back than the closed block. Similar results can be seen in Group II. Additionally, in Group II, the failed bit count (FBC) at 1E-4 SFR is much higher than the FBC of Group I at 1E-4 SFR. Further, the high EP cycle (1.5 k) and lower percentage of programmed wordlines (i.e., the lower the value of the boundary wordline (BWL)) result in worse SFR of the boundary wordline in the open block than the closed block. Additionally, due to the back pattern effect, the partially-programmed (open block) Vt shifts to left, but Vt width and Vt margin of the open block and the closed block are comparable. For both cases, the left tail substantially develops, and Vt broadening occurs during pre-bake. Also, the open block and the closed block have comparable Vt width and Vt margin throughout pre-bake and post-bake.

The above-described data was plotted with page optimal read levels (i.e., the most optimal read level for the page is found using a bit error rate (BER) estimate scan (BES) algorithm, and then the failed bit count is calculated). The data clearly shows that the boundary wordline FBC is a problem with data retention even after the block is closed (i.e., even after the storage system has closed the block, the wordline that was a boundary for a long time and saw data retention will show higher FBC). Current consumer solid state drives (CSSD) do not use page-optimal read levels but instead use a die-optimal read level. The FBC due to a die-optimal read level will be much worse compared to the page-optimal read level. Thus, the SFR curves in the drawings will be pushed out even further, and the boundary wordline will be more susceptible to higher FBC.

The following embodiments can be used to alleviate the boundary wordline problem and ensure that FBC is comparable to the other closed wordlines. In this example, data is stored both in an SLC block and a QLC block. By having two copies of the data stored, the data in the more-reliable SLC block will be available if the data in the QLC block is not reliable. However, at some point, the data will need to be de-committed from the SLC block to allow the SLC block to store additional data (e.g., incoming data from a host). When data is committed to the QLC block (e.g., during a rolling fold), data is de-committed from the SLC block.

Figure 6:
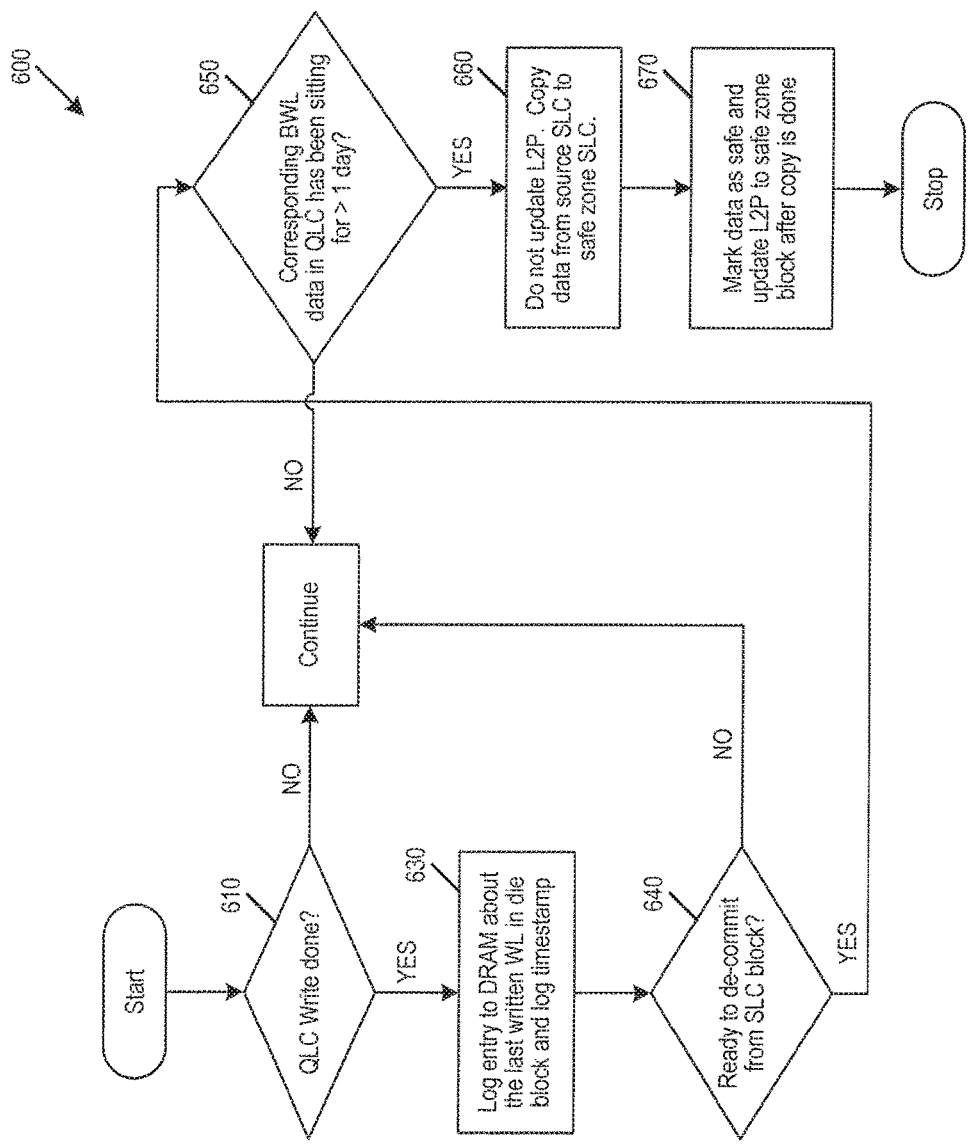
FIG. 6 is a flow chart of a method of an embodiment for boundary wordline data retention handling.

In one embodiment, which is illustrated in the flow chart 600 in FIG. 6, the storage system 100 (e.g., the controller 102 or the boundary wordline data retention hander 111) determines if the QLC write is done (act 610). If it is, the controller 102 logs an entry in the storage system's volatile memory (e.g., in a table in DRAM) regarding the last written wordline (i.e., the boundary wordline) in the die block and a log timestamp of when the write occurred (act 630). In one embodiment, there is one entry in the table per die block if the memory is programmed in dual-plane mode. When the controller 102 determines that it is ready to de-commit data from the SLC block (e.g., after every two QLC wordlines in finish fine programming) (act 640), the controller 102 determines if the data in the boundary wordline has been sitting there for more than a threshold amount of time (e.g., more than one day) (act 650). For example, the controller 102 can check the table to see how long ago the data was written to the QLC block in order to determine whether an amount of time that has passed since a last-written wordline in the QLC block was written is longer than a threshold amount of time. This would indicate the probability of a data retention problem.

If the data has aged a long time, the data in the boundary wordline may not be reliable, and action is needed. In this embodiment, instead of updating the logical-to-physical (L2P) address map immediately, the controller 102 copies data from a wordline in the SLC block that corresponds to the boundary written to a wordline in the secondary SLC block, which is referred to herein as a "safe zone SLC" (act 660). The controller 102 also updates a logical-to-physical (L2P) mapping table to reflect this copying, and the entry in the table is marked as safe (act 670). That way, when the storage system 100 receives a command to read the data in the MLC block, it can read the data from the wordlines prior to the boundary wordline in the MLC block, and, instead of reading the boundary wordline in the MLC memory area, read the data from the wordline in the safe zone SLC. With the boundary wordline data retention problem handled, the controller 102 can de-commit the data from the SLC block.

Figure 7:
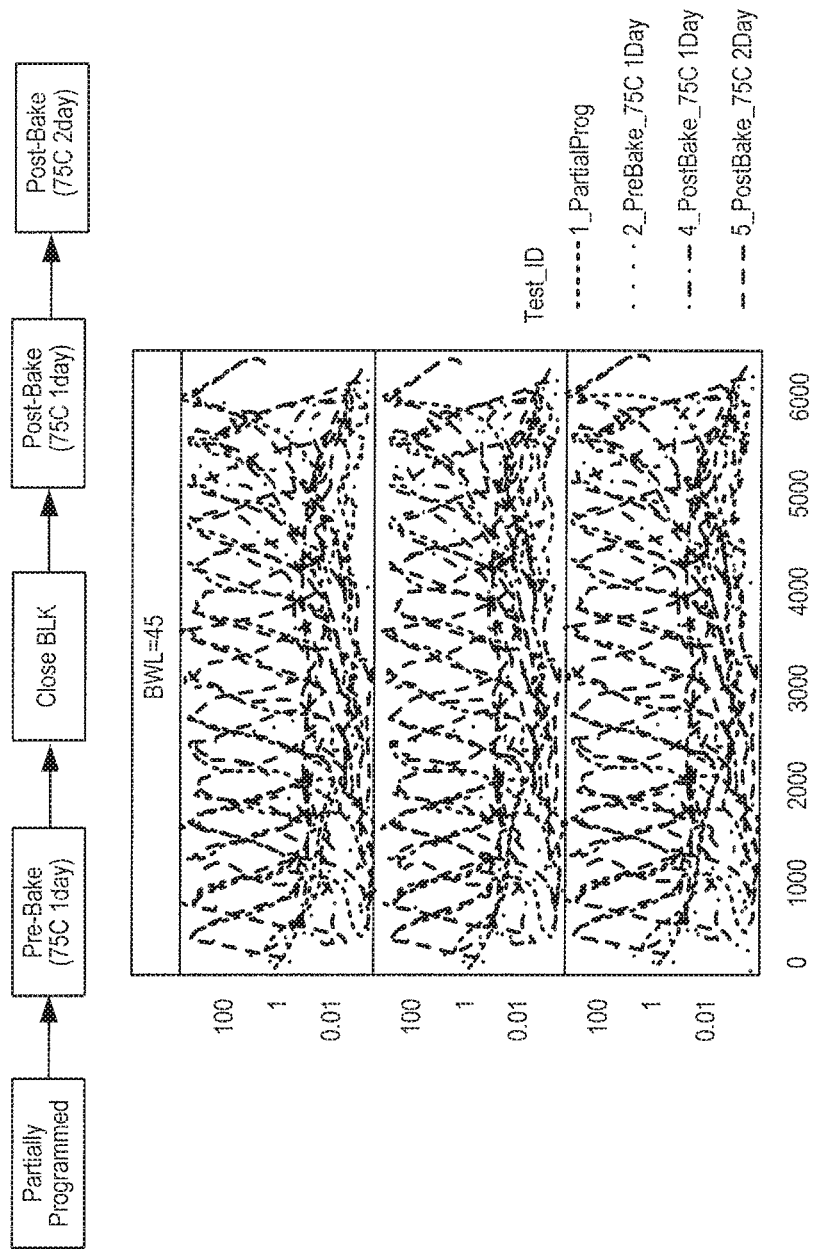
FIG. 7 is a graph of an embodiment showing that a data retention problem can be fixed by doing a double-fine program operation.

In another embodiment, instead of "patching in" data from the SLC safe zone when the data is read from the MCL block, the boundary wordline in the MLC block can be reprogrammed to fix the problem. Returning to the drawings FIG. 7 is a graph of an embodiment that shows how the problem can be fixed. More specifically, as shown in the graph, after one day of baking, the lower tails of the upper states shift down more. To fix this, the storage system 100 can simply repeat the fine stage of the foggy-fine program (e.g., to do a double-fine program operation). Thus, if after the post one-day bake the boundary wordline has not changed, redoing the last step of the foggy-fine program will fix the Vts, thereby leading to a reduction in the bit error rate. This embodiment is illustrated in the flow chart 800 in FIG. 8.

Figure 8:
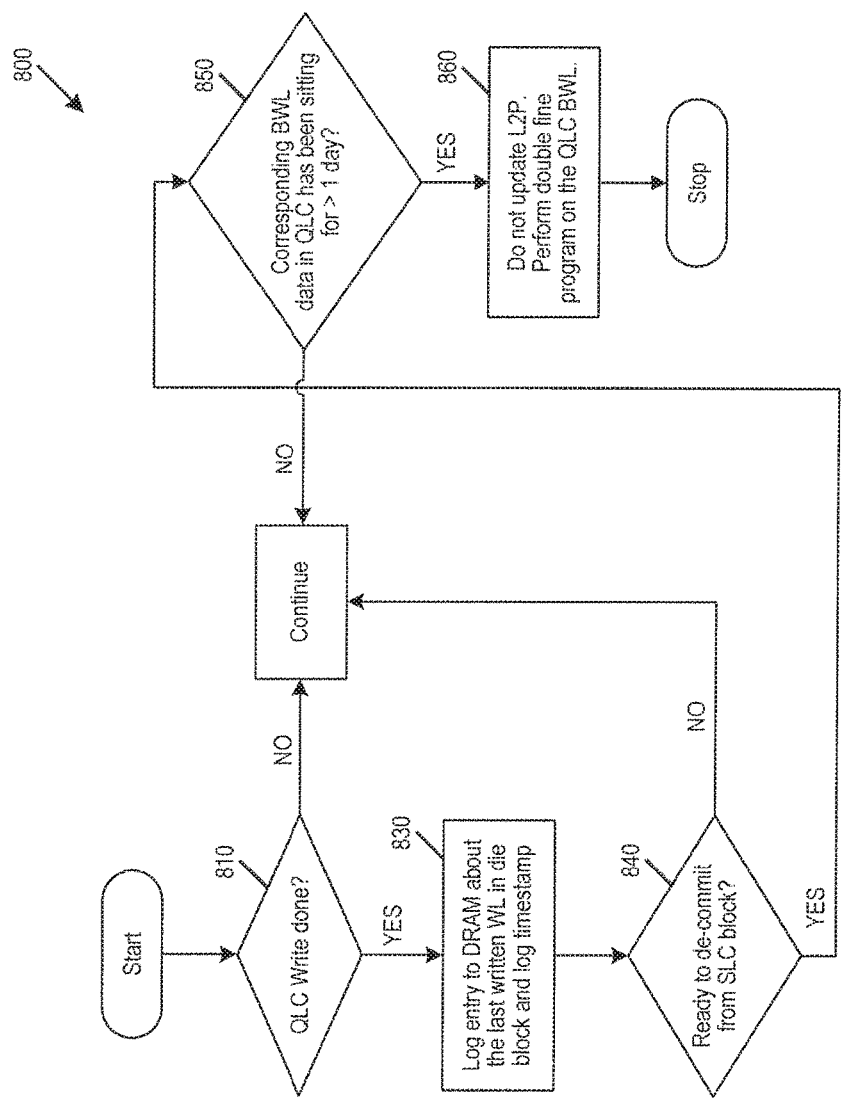
FIG. 8 is a flow chart of a method of an embodiment for boundary wordline data retention handling.

As shown in FIG. 8, as with the method shown in FIG. 6, the method starts out by performing acts 810, 830, 840, and 850, which are similar to acts 610, 630, 640, and 650 in FIG. 6. However, instead of copying the data to the safe zone SLC if the data in the boundary wordline has been sitting around too long, in this embodiment, the boundary wordline is re-programmed (e.g., using a double fine programing technique) (act 860). More information about foggy-fine program operations can be found in U.S. Pat. No. 10,515,008, which is hereby incorporated by reference.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:
1. A storage system, comprising:
a memory comprising a first single-level cell (SLC) memory area, a second SLC memory area, and a multi-level cell (MLC) memory area; and
a controller configured to communicate with the memory and further configured to:
  write data to both the first SLC memory area and the MLC memory area;
  determine whether the controller is ready to de-commit the data from the first SLC memory area in response to a threshold number of wordlines in the MLC memory area finishing a multi-stage programming operation; and in response to determining that the controller is ready to de-commit the data from the first SLC memory area:
    determine whether an amount of time that has passed since a last-written wordline in the MLC memory area was written is longer than a threshold amount of time; and
    in response to determining that the amount of time is longer than the threshold amount of time:
        copy data from a wordline in the first SLC memory area that corresponds to the last-written wordline in the MLC memory area to a wordline in the second SLC memory area; and
        update a mapping table to reflect the copy.

2. The storage system of claim 1, wherein the controller is further configured to, in response to a command to read the MLC memory area:
    read data from wordlines written prior to the last-written wordline in the MLC memory area; and
    instead of reading the last-written wordline in the MLC memory area, read the data from the wordline in the second SLC memory area.

3. The storage system of claim 1, wherein the controller is further configured to log an identification of the last-written wordline in the MLC memory area and a time when the last-written wordline was written.

4. The storage system of claim 3, wherein the identification and time are logged in volatile memory in the storage system.

5. The storage system of claim 1, wherein the controller is further configured to de-commit the data from the first SLC memory area.

6. The storage system of claim 1, wherein the MLC memory area comprises a quad-level cell (QLC) memory area.

7. The storage system of claim 1, wherein the memory comprises a three-dimensional memory.

8. The storage system of claim 1, wherein the storage system is configured to be integrated in a host.

9. The storage system of claim 1, wherein the storage system is configured to be removably connected with a host.

10. The storage system of claim 1, wherein the controller is ready to de-commit the data after completing a rolling fold operation.

11. In a storage system including a memory comprising a single-level cell (SLC) block and a multi-level cell (MLC) block, a method comprising:
    programming data to both the SLC block and the MLC block;
    determining whether the storage system is ready to de-commit the data from the SLC block in response to a threshold number of wordlines in the MLC block finishing a multi-stage programming operation; and
    in response to determining that the storage system is ready to de-commit the data from the SLC block:
        determining whether a predetermined amount of time has passed since a boundary wordline in the MLC block was programmed; and
        in response to determining that the predetermined amount of time has passed, re-programming the data in the boundary wordline in the MLC block.

12. The method of claim 11, wherein the data is programmed in the boundary wordline in the MLC block using a fine programing technique, and wherein the data is re-programmed in the boundary wordline using a double fine programing technique.

13. The method of claim 11, further comprising logging an identification of the boundary wordline in the MLC block and a time when the boundary wordline was written.

14. The method of claim 13, wherein the identification and time are logged in volatile memory in the storage system.

15. The method of claim 11, further comprising de-committing the data from the SLC block.

16. The method of claim 11, wherein the MLC block comprises a quad-level cell (QLC) block.

17. The method of claim 11, wherein the storage system is ready to de-commit the data after a rolling fold operation.

18. A storage system, comprising:
    a memory comprising a first single-level cell (SLC) memory area, a second SLC memory area, and a multi-level cell (MLC) memory area;
    means for writing data to both the first SLC memory area and the MLC memory area;
    means for determining whether the storage system is ready to de-commit the data from the first SLC memory area in response to a threshold number of wordlines in the MLC memory area finishing a multi-stage programming operation; and
    means for, in response to determining that the storage system is ready to de-commit the data from the first SLC memory area:
        determining whether an amount of time that has passed since a last-written wordline in the MLC memory area was written is longer than a threshold amount of time; and
        in response to determining that the amount of time is longer than the threshold amount of time:
            copying data from a wordline in the first SLC memory area that corresponds to the last-written wordline in the MLC memory area to a wordline in the second SLC memory area; and
            updating a mapping table to reflect the copy.

19. The storage system of claim 18, further comprising means for re-programming the data in the last-written wordline in the MLC memory area.

20. The storage system of claim 19, wherein the data is programmed in the last-written wordline in the MLC memory area using a fine programing technique, and wherein the data is re-programmed in the last-written wordline using a double fine programing technique.

21. The storage system of claim 18, further comprising means for logging an identification of the last-written wordline in the MLC memory area and a time when the last-written wordline was written.

22. The storage system of claim 18, wherein the storage system is ready to de commit the data from the SLC memory area after a rolling fold operation.

* * * * *